United States Patent [19]

Gilcher

[11] 4,188,002

[45] Feb. 12, 1980

[54] VITAL POWER VARISTOR CIRCUIT FOR RAILROAD SIGNALING SYSTEMS

[75] Inventor: Heinz Gilcher, Export, Pa.

[73] Assignee: Westinghouse Air Brake Company, Swissvale, Pa.

[21] Appl. No.: 953,527

[22] Filed: Oct. 23, 1978

[51] Int. Cl.² ............................................. B61L 21/06
[52] U.S. Cl. .................................. 246/34 R; 324/87; 328/133; 329/50
[58] Field of Search .............. 246/34 R, 34 CT, 34 D; 361/42, 182; 324/83 R, 83 A, 87, 140 R, 140 D; 307/232; 328/133; 323/106; 329/50

[56] References Cited

U.S. PATENT DOCUMENTS

| 3,662,227 | 5/1972 | Morrison | 307/232 |
| 3,986,691 | 10/1976 | Ehrlich | 246/34 R |

*Primary Examiner*—Reinhard J. Eisenzopf
*Attorney, Agent, or Firm*—A. G. Williamson, Jr.; R. W. McIntire, Jr.

[57] ABSTRACT

A vital circuit network, equivalent to a two element, alternating current track relay used as a synchronous detector, has a first input transformer directly coupled across the local track circuit source and second input transformer coupled across the track rails through a band pass filter tuned to the track circuit frequency. The transformers are designed to normally produce secondary output signals of the same range, which are connected into a series circuit network including a second band pass filter, a varistor, a full-wave rectifier, and a protective fuse, with a biased track relay connected across the rectifier D. C. output. From the two voltage signals in the series network, the varistor produces a product current signal which is rectified to provide an output sufficient to pick up the track relay only when both input signals are present, are of the track circuit frequency, and are within a predetermined phase relationship. The varistor circuit network has a sharp rejection of input signals outside the predetermined phase relationship or of a nonselected frequency.

11 Claims, 5 Drawing Figures

VITAL POWER VARISTOR CIRCUIT FOR RAILROAD SIGNALING SYSTEMS

BACKGROUND OF THE INVENTION

My invention pertains to a power varistor circuit arrangement for use in railroad signaling systems. More specifically, the invention relates to a vital varistor circuit arrangement usable as a track relay means in alternating current track circuits on electrified railroads.

As a matter of economy and efficiency, electrified railroads in the United States are planning to change to commercial 60 Hz propulsion power sources to replace the long used 25 Hz propulsion power generated by special apparatus at privately owned generating stations. Any new electrification will also be at the commercial power frequency. The signaling systems in such electrified railroads have for many years used 100 Hz alternating current (A.C.) track circuits including centrifugal type track relays which are effectively two winding, dual input, synchronous motor or detector devices designed to be immune to the 25 Hz propulsion current flowing in the rails. One winding of the relay is energized direct from the track circuit power source. The second winding receives energy through the section rails from the same track circuit source connected at the other end. The relay operates to indicate an unoccupied track section only when both windings are energized by track circuit frequency currents having a phase angle relationship within predetermined limits. It is impractical, in the process of changing propulsion frequency, to also change out the existing 100 Hz track circuits. However, the present centrifugal relays are not sufficiently immune to the 60 Hz frequency to assure no response by the relays to propulsion currents of the new frequency flowing in the rails. In addition, centrifugal relays inherently require considerable and frequent preventative maintenance to assure proper and reliable operation. Therefore, it is desirable, actually required to substitute a passive network not responsive to 60 Hz currents which will permit continued use of the 100 Hz track circuits but with conventional, vital direct current (D.C.) track relays which will not respond to, that is, which are immunized from, propulsion currents whether of the 25 or 60 Hz frequency.

Accordingly, an object of my invention is a passive circuit network for controlling a vital relay which serves as the track relay for alternating current track circuits in electrified railroads.

Also an object of my invention is a vital power varistor detector circuit arrangement responsive only to dual input signals of the same preselected frequency and within a predetermined phase relationship.

Another object of the invention is a varistor circuit arrangement to replace frequency and phase responsive track relays in vital, alternating current railroad track circuits.

A further object of my invention is an improved frequency selective track relay means for alternating current track circuits in electrified railroads.

Still another object of the invention is a track circuit arrangement for electrified railroads including a tuned varistor circuit network at the receiving end for energizing a vital track relay only in response to received energy of the preselected track circuit frequency.

Also an object of the invention is a synchronous detector circuit network including a varistor which replaces the centrifugal track relay in alternating current track circuits for electrified railroads.

A still further object of my invention is a varistor circuit network responsive to inputs from two phase related sources having the same preselected frequency for producing a registerable output signal only if both inputs are present, are of the same frequency, and are within a predetermined phase relationship.

It is also an object of the invention to supply, for an electrified railroad track section using impedance bonds for the propulsion power return, an alternating current track circuit which includes a source of alternating current energy, having a frequency different from that of the propulsion power, connected across the rails at one end and a train detector means having a first input coupled to the track circuit source and a second tuned input coupled across the rails at the other end of that section, the input signals being processed in a circuit network including a tuned filter path and a varistor device to energize a vital track relay to register an unoccupied track section only if both input signals of the track circuit frequency are received and are within a predetermined phase relationship.

Other objects, features, and advantages of the invention will become apparent from the following specification and appended claims when taken in connection with the accompanying drawings.

SUMMARY OF THE INVENTION

According to the invention, a vital circuit arrangement with two input means is supplied with two signals of the same preselected frequency. The circuit network, tuned to the preselected frequency, so couples the input means, a varistor device, and a registry means in series that only the simultaneous input of two signals, both of the preselected frequency and having a predetermined phase relationship, is registered. Also according to the invention, this circuit arrangement, when substituted for a dual input, frequency responsive track relay in an alternating current track circuit for electrified railroads, continues to inhibit track circuit response to propulsion currents of a different but closely spaced frequency flowing in the rails and thus prevents the improper registration of an unoccupied track section indication when a train is present or a rail break exists.

In the specific practice of the invention in a circuit arrangement intended for use in track circuits of electrified railroads, the input means are coupling transformers. One such transformer is coupled to receive an input signal direct from the track circuit source which has a frequency different from that of the propulsion power for the railroad. The second input transformer is of the saturable type and is connected across the rails at the receiver end of the corresponding track section to receive signals through the rails from the track circuit source which is connected across the rails at the other or transmitter end of the section. These track signals pass through an input filter element tuned to pass only the track circuit frequency and block signals of the propulsion frequency. The transformer secondary windings, which are designed to provide relatively equal voltage signals under normal conditions, are connected in series with another tuned filter path and a varistor device to the input terminals of a full-wave rectifier. The output of the rectifier is supplied to a vital type biased D.C. relay which becomes the final track relay for that track section. Sufficient output is produced to pick up the track relay to register an unoccupied track section only when the sum of the transformer secondary voltages, because both inputs have sufficient energy levels, are of the same frequency, and are within the predetermined phase relationship, is above the level which causes the varistor element dynamic or A.C. impedance to decrease and pass sufficient current to the rectifier for energizing the relay. This vital varistor circuit arrangement is sharply responsive to the phase relationship and the frequency of the input signals to eliminate improper and unsafe response to high levels of propulsion current or harmonics thereof, even though of a closely spaced frequency.

BRIEF DESCRIPTION OF THE DRAWINGS

I shall now specifically describe a preferred vital varistor circuit arrangement embodying the invention, referring to the accompanying drawings in which.

In each of the drawing figures, similar reference characters designate the same or similar functions or apparatus.

DESCRIPTION OF THE ILLUSTRATED EMBODIMENTS

Figure 1:
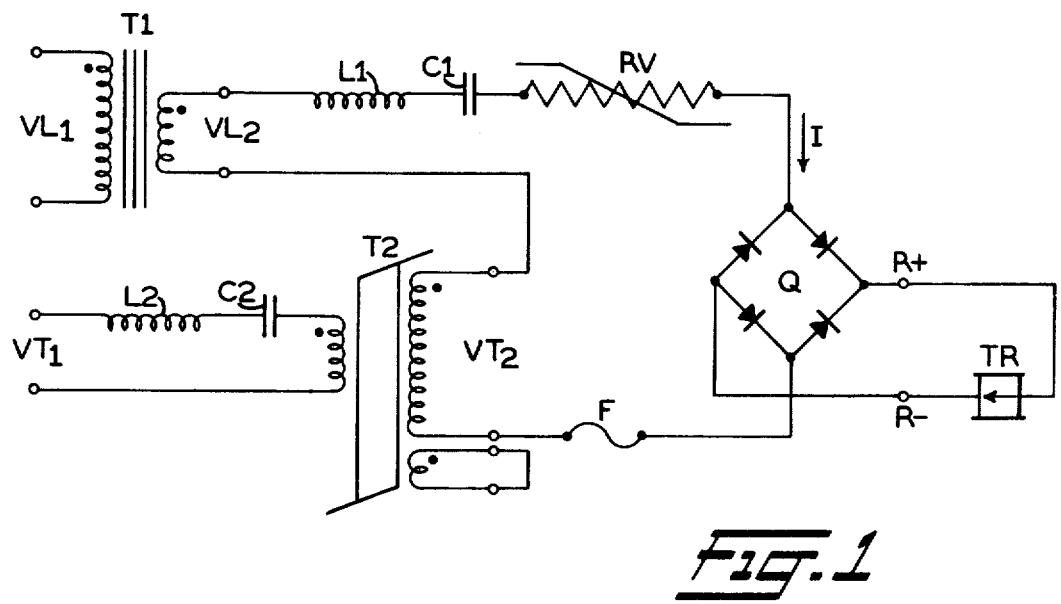
FIG. 1 is a circuit diagram of a vital circuit arrangement including a varistor, for registering the presence or absence of two input signals by the operating position of a vital relay, which arrangement embodies my invention.

Reference is first made to FIG. 1 which shows a vital power varistor circuit arrangement which is the heart or basis of my invention. Two input transformers T1 and T2 are used to couple signals from two energy sources into the operating circuit network. Each transformer is shown in a conventional manner with dot symbols to designate simultaneous corresponding polarity ends of the various windings. The primary of transformer T1 is connected across a local source of alternating current energy normally supplied over a line wire circuit from a central source. This received input signal is designated as signal $VL_1$ and, in a commonly used signal system, its frequency is 100 Hz. Transformer T1 is designed to provide a secondary output voltage signal $VL_2$ at a proper level for use in the operating circuit network. In other words, transformer T1 is a step-down transformer so that its secondary voltage signal is of a comparative level or range with that provided by the other input means.

Transformer T2 is of the saturable type and is a step-up transformer with its primary winding connected to a second signal source, supplying an input signal $VT_1$, through a noise rejection filter path comprising the inductor L2 and the capacitor C2. The resulting series LC filter element, including this inductor and capacitor and the primary winding of transformer T2, provides a band pass arrangement tuned to the signal source frequency. Signal $VT_1$, as will be shortly discussed, is supplied from a distant point, by the same central source that supplies signal $VL_1$, over a transmission means extending between the two locations. As later defined, the specific transmission means may be the rails of the track section for which the track circuit is intended. Therefore, the frequency of signal $VT_1$, in the specific example, is also 100 Hz. The filter element, inductor L2, capacitor C2, and the primary of transformer T2, is tuned to this 100 Hz frequency to limit excessive noise amplitude which results, at least partly, from the electrical propulsion current flowing in the rails of the track section, as will be shortly explained. To swamp out the nonlinear loading influence of the varistor element, which will be discussed shortly, a heavy duty, single turn winding with a short circuit connection is added to transformer T2 to present a low impedance load to the transformer under all conditions. As previously noted, transformer T2 is a step-up transformer whose output signal $VT_2$ from the secondary winding is of the same order of magnitude as signal $VL_2$ under normal conditions in the input signals, for example, from the track circuit and the local source. The saturable characteristic of transformer T2 limits the input signal when excessive voltage levels occur in the second source. By way of specific example, this situation may occur, in track circuit use, when an insulated joint failure allows the transmitted signal from the adjoining track section to feed direct into the receiving apparatus.

The secondary windings of transformers T1 and T2 are connected in series to supply the sum of the input signals $VL_2$ and $VT_2$ to energize the remainder of the passive circuit network. This series network includes a series tuned band pass filter element comprising inductor L1 and capacitor C1 and tuned to 100 Hz in this specific example, a varistor device RV of the metal oxide type, the input terminals of a full-wave rectifier Q, and an instrument type fuse F. A vital type, biased, direct current relay TR is connected to the output terminals of rectifier Q, designated by the symbols R + and R −, to complete the circuit network. Relay TR is the registry means for the input signals when they have subsequently discussed characteristics. A current arrow I, shown between varistor RV and rectifier Q, designates a flow of current in this circuit network to provide a reference to relate circuit operation to the charts of FIGS. 3, 4, and 5.

Figure 3:
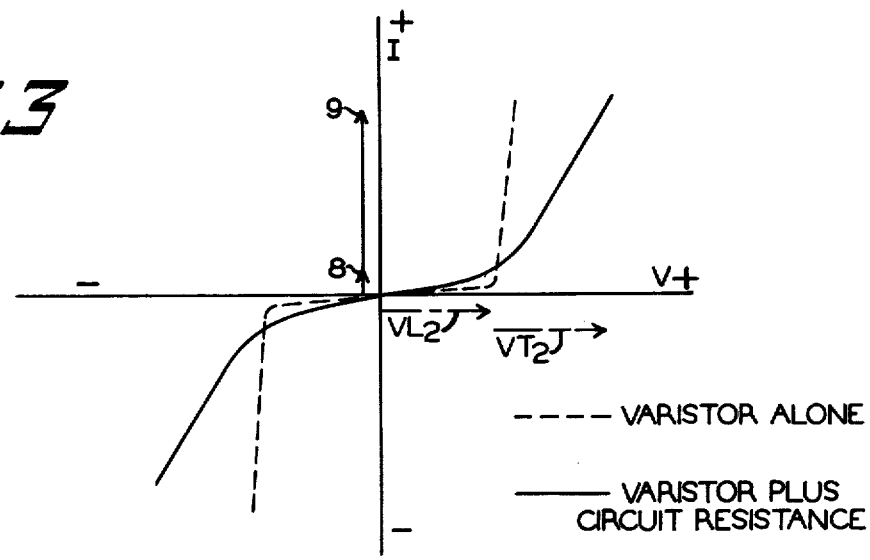
FIG. 3 is a chart showing the level of current flow in the FIG. 1 circuit as a function of the product of the input signal levels.
Figure 4:
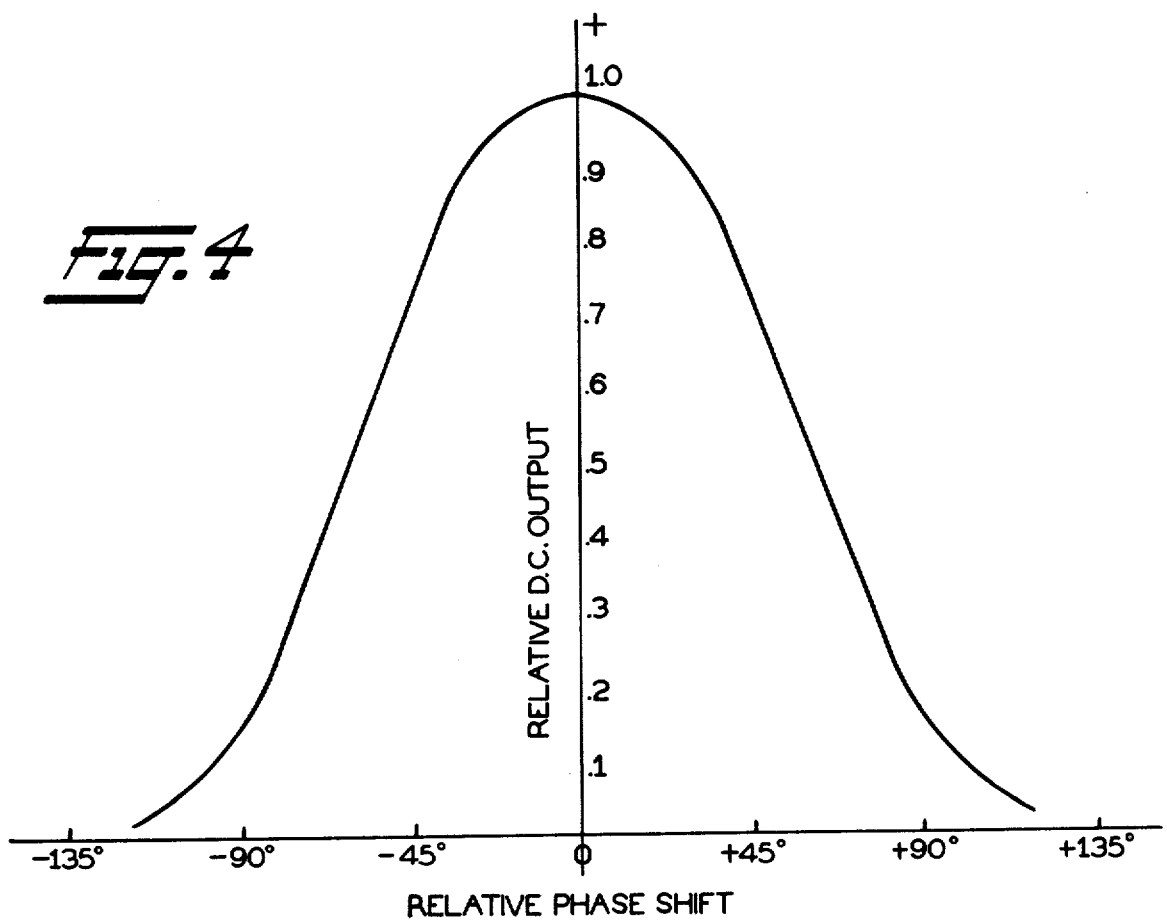
FIG. 4 is another chart illustrating the output level of the FIG. 1 circuit as a function of the phase shift between the input signals.

The voltage (V)-current (I) characteristics of the varistor are illustrated by the dashed curve shown in FIG. 3. The associated solid curve illustrates the V-I characteristics of the varistor plus other circuit network resistances. In the presence of a local input $VL_1$ only, the output of the transformer T1 secondary, the signal $VL_2$, is applied to the circuit network and produces only the small output current vector 8 shown immediately to the left of the vertical axis of the chart of FIG. 3. When the second or track input is also active, an equal amplitude voltage is produced at the transformer T2 secondary and this signal $VT_2$ is applied to the network relatively in phase with signal $VL_2$. The two voltage vectors add in phase, as illustrated by the designated symbols in the lower right quadrant of the chart, thus shifting to the dynamic resistance part of the curve to produce the large current vector 9 shown to the left of the vertical axis line. In other words, a result of the nonlinear circuit transfer characteristics of the varistor, adding the two input voltage vectors produces a total current roughly proportional to the voltage product. As another means of understanding this action, this calculation is performed similar to the manipulation of a conventional slide rule wherein logarithmic distances are added to provide a product. The actual current through the biased relay TR then is a pulsed direct current produced by the full-wave rectifier Q. Said in another way, this varistor circuit network acts as a synchronous detector having a direct current output relationship, with respect to the relative phase angle between the input signals, illustrated by the chart of FIG. 4.

Figure 2:
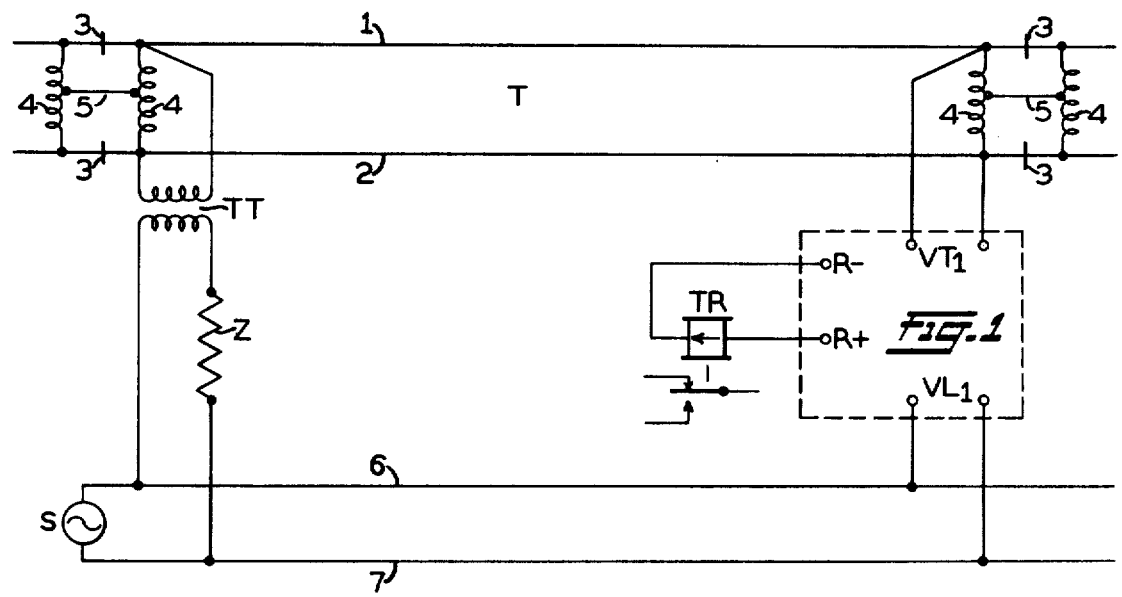
FIG. 2 illustrates schematically the use of the varistor circuit arrangement of FIG. 1 as a dual input track relay means in an alternating current track circuit.

Referring now to FIG. 2, a track section T of a stretch of electrified railroad is shown with its rails 1 and 2 illustrated by conventional single line symbols. The rails of section T are electrically insulated from the rails of the adjoining sections by the insulated joints 3, also illustrated by conventional symbols. In order to provide a return circuit for the propulsion current, impedance bond windings 4 are connected across rails 1 and 2 at each end of section T and the associated ends of the adjoining sections. The center taps of each associated pair of bond windings 4 are connected by a lead 5 to provide a conventional circuit path through section T for propulsion current. It is here assumed that the frequency of the propulsion power is the commonly used 25 or 60 Hz.

The signaling system for this stretch of railroad is based on continuous train detection using a track circuit for each track section such as section T. Signaling energy for the track circuits is provided from a central source S shown conventionally at lower left, having a frequency, for example, of 100 Hz, and is distributed along the stretch of railroad by the line wires 6 and 7. Energy is supplied across the rails of section T at the left or transmitting end through a track transformer TT from line circuit 6, 7. The supply connections include a selected resistor Z which limits the current flow when a train shunts the rails at the transmitting end. Track transformer TT may be incorporated as part of the impedance bond but it is normally preferable to have a separate transformer, as shown. At the other or receiving end of section T, the varistor circuit arrangement of FIG. 1 is connected across the rails and to the line circuit. This circuit arrangement is illustrated by a dashed block with input terminals and rectifier output terminals designated by the same reference as FIG. 1. In other words, terminals $VL_1$ are connected across line circuit 6, 7 and terminals $VT_1$ across rails 1 and 2 at the impedance bond connections. Track relay TR, of the same biased type previously illustrated, is connected across terminals $R+$ and $R-$ with proper polarity direction.

In considering the operation of the track circuit of FIG. 2, it is to be remembered that the vital varistor network shown in FIG. 1, when connected within the track circuit of FIG. 2, acts as a two element, alternating current track relay device. The track circuit is adjusted under minimum ballast conditions (wet weather and low ballast resistance) so that the track and local signal currents are in phase at the receiver end. Under these conditions, track current is near the minimum level required to pick up relay TR. That is, direct current output from the dashed block is at the relative 1.0 level shown in the charts of FIGS. 4 and 5, i.e. the peak of each curve. With no train shunt or broken rail in section T, the $VL_2$ and $VT_2$ signal vectors (FIG. 3) are both present and add in phase so that the current function is at a high level on the curve in the upper right quadrant and sufficient energy is output to pick up relay TR. When a train occupies section T and creates a shunt between the rails, signal $VT_2$ is absent and signal $VL_2$ alone produces insufficient output energy, since the current I is on the low, flat part of the varistor curve, so that relay TR releases to register an occupied track condition. When ballast resistance of the section is high (dry conditions), the track current and thus signal $VT_1$ is at a maximum level. In addition, the phase of the track current leads that of the local current supplied from circuit 6, 7 (signal $VL_2$) so that the direct current output is attenuated, that is, the function shifts to the right, on the chart of FIG. 4, along the curve to a relative position less than 1.0. However, the larger $VT_1$ input signal under dry ballast conditions compensates for the reduced multiplier function, from the phase shift curve, so that sufficient output still exists to energize relay TR to pick up to register the unoccupied condition of section T.

Figure 5:
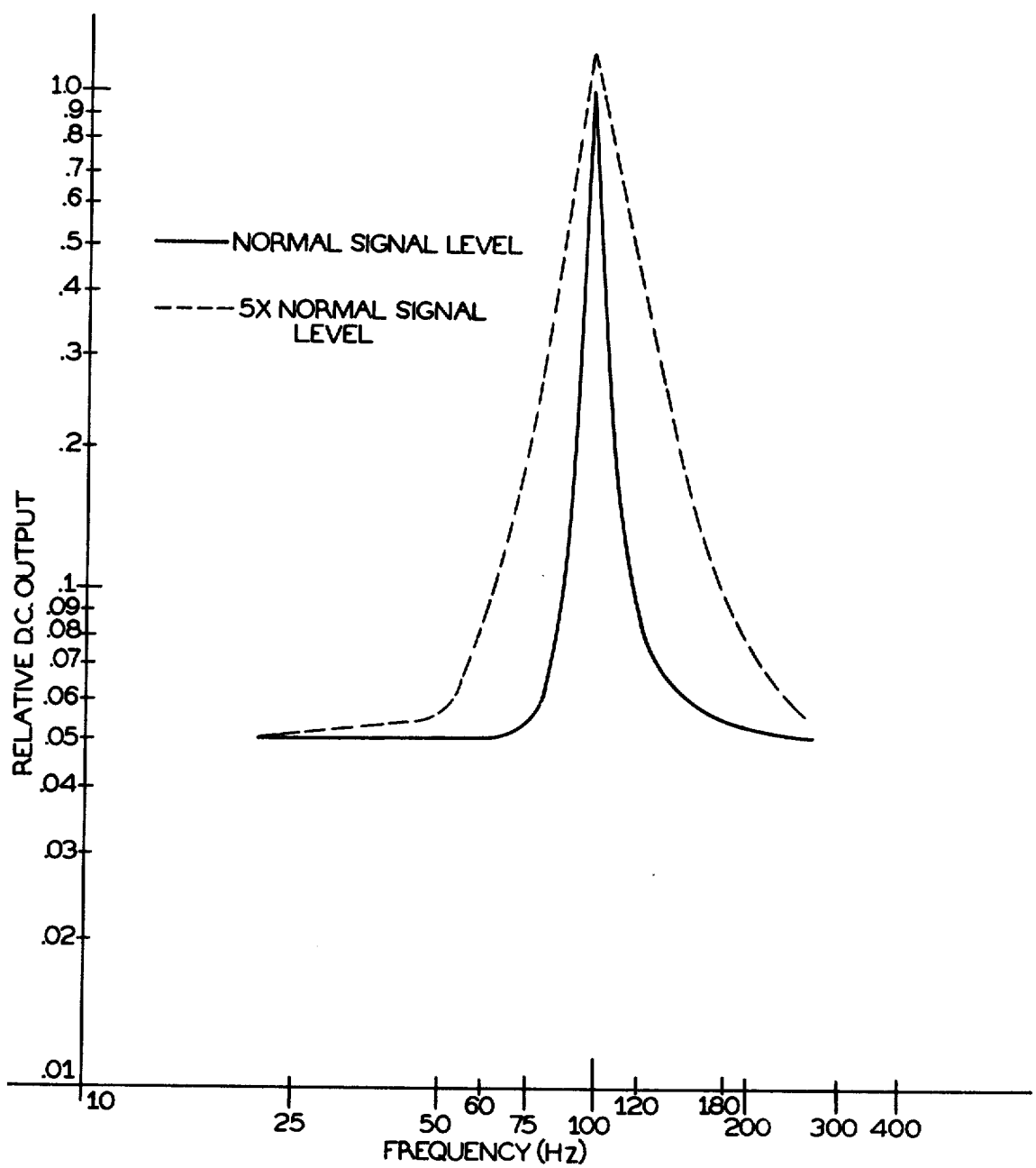
FIG. 5 is another chart depicting the relative output of the FIG. 1 circuit as a function of the frequency of the track voltage signal.

This varistor circuit arrangement also has the ability to reject high level track signals at the propulsion frequency, as shown in FIG. 5. This chart is based on the assumed specific condition of the use of the common 100 Hz track circuit. As shown in the chart, the varistor circuit network response peaks at this frequency. However, both the solid normal and dashed high track input signal level curves illustrate a sharp rejection, that is, a reduction of the direct current output, at both 25 Hz and 60 Hz propulsion power and the common second and third harmonics of these frequencies. Even with five times the normal signal level input from the track circuit at 120 Hz, the second harmonic of the proposed 60 Hz propulsion current, the relative direct current output is reduced below the 0.5 level of its peak at the tuned frequency of 100 Hz.

The varistor circuit network is considered vital for several reasons. Any input transformer failure, either an open or short circuited winding, results in a decreased output signal level into the varistor network. The single shorted turn of transformer T2 is considered vital since, because of the large size wire used, it cannot open circuit. An open or short circuit failure in inductors L1 or L2 or capacitors C1 or C2 results in decreased relay current. The varistor also consists of a bulk material which, like a resistor, can open but cannot short circuit. To insure that the varistor cannot be electrically abused and its characteristics altered, the instrument fuse F is used in the circuit network for current limiting purposes. If a bridge diode in rectifier Q open circuits, the relay experiences a decrease in the energy supplied. If a diode short circuits, the resulting alternating current output decreases the average direct current level and causes the biased relay to release.

The circuit arrangement of the invention thus provides an improved track circuit for electrified railroads. The two element type circuit uses passive elements except for the final registry relay which is a conventional, vital type, direct current relay of high reliability and safety. Maintenance of the track circuit network is reduced and reliability is increased. The excellent phase angle and frequency response characteristics are retained so that broken rails may be detected and high levels of propulsion current signals in the track rejected by the relay equivalent circuitry. This results in an efficient and economical track circuit apparatus which may be used to replace the older centrifugal relays in either 25 Hz or 60 Hz propulsion territory.

Although I have herein shown and described but a single form of the vital varistor circuit network embodying my invention and its use only as a substitute for a two element track circuit relay, it is to be understood that various changes and modifications of the illustrated arrangements may be made within the scope of the appended claims without departing from the spirit and scope of my invention.

Having now described the invention, what I claim as new and desire to secure by Letters Patent, is:

1. A vital frequency selective varistor circuit arrangement for registering the presence or absence of at least one of two received signals, comprising in combination,
   (a) a first input means coupled for receiving a first input signal from a first source supplying an alternating current of a preselected frequency,
   (b) a second input means coupled for receiving a second input signal from a second source supplying an alternating current signal normally of said preselected frequency and having a variable phase relationship with said first source,
   (c) a varistor device,
   (d) a registry means normally occupying a first position and operable to a second position, and
   (e) a circuit network tuned to said preselected frequency and coupling said first and second input means, said varistor, and said registry means in series for operating said registry means to its second position to register the simultaneous input of both signals only when of said preselected frequency and within a predetermined phase relationship.

2. A varistor circuit arrangement as defined in claim 1 in which,
   (a) said second source is a transmission means over which said second signal is supplied from said first source,
   (b) the presence and absence of said second signal represents a first and a second condition, respectively, of said transmission means to be registered, and
   (c) said registry means is operated to its second position for registering the first condition of said transmission means.

3. A varistor circuit arrangement as defined in claim 2 in which,
   (a) said transmission means also carries energy having a different frequency characteristic,
   (b) said first input means is a transformer for coupling said first source to said circuit network,
   (c) said second input means is a saturable transformer including a short-circuited single turn winding for providing a constant low impedance load and a secondary winding coupled into said circuit network, and which further includes,
   (d) a filter element coupling the primary of said saturable transformer to said transmission means for tuning the corresponding input circuit path to said preselected frequency.

4. A varistor circuit arrangement as defined in claim 3 in which,
   (a) said registry means is a vital, biased, direct current relay operable between a first released position when deenergized and a second energized position, and in which said circuit network further includes in the series circuit,
   (b) a filter element tuned to said preselected frequency, and
   (c) a full-wave rectifier element for providing direct current energy to said registry relay when both input signals are present.

5. A varistor circuit arrangement as defined in claim 4 in which,
   (a) said transmission means comprises the rails of an insulated track section of an electrified railroad, which rails also carry propulsion return current of a different frequency,
   (b) said first and second conditions of said transmission means are said track section unoccupied and occupied, respectively, and
   (c) said registry relay registers an unoccupied section only when operated to its energized position.

6. Synchronous occupancy detector apparatus, for an alternating current track circuit for a track section of an electrified railroad, said track circuit being supplied with operating energy from a source having a preselected frequency different from the frequency of the propulsion current also flowing in the track rails, comprising,
   (a) a first input means directly coupled to said track circuit energy source for receiving a first signal of said preselected frequency,
   (b) a tuned second input means coupled to the rails at the receiver end of said section for receiving a second signal, only of said preselected frequency, through the rails when said section is unoccupied, from said track circuit energy source connected to said rails at the other end of said section, said second signal also having a variable phase relationship with said first signal,
   (c) a varistor element,
   (d) a filter element tuned to said preselected frequency,
   (e) a registry means normally occupying a first position and operable to a second position when energized for registering an unoccupied track section indication,
   (f) a circuit network coupling said varistor element, said filter element, and said registry means in series with said first and second input means for receiving said first and second signals from said track circuit source and said rails, respectively, and responsive thereto for energizing said registry means to operate to its second position only when both signals are received, are each of said preselected frequency, and are within a predetermined range of phase relationship.

7. Synchronous detector apparatus as defined in claim 6 in which said registry means comprises,
   (a) a full-wave rectifier connected in series into said circuit network for rectifying the alternating current energy passed by said filter and varistor elements, and
   (b) a vital direct current relay connected for receiving the rectified energy produced by said rectifier and responsive thereto for registering an unoccupied track section indication when sufficient energy is passed through said circuit network.

8. A synchronous detector apparatus as defined in claims 6 or 7 in which,
   (a) said first input means is a step-down transformer coupled to said track circuit source for inducing said first signal of said preselected frequency in the transformer secondary winding,
   (b) said second input means comprises another tuning element and a step-up amplitude limiting saturable transformer,
      (1) said other tuning element and the transformer primary winding are coupled in series to said section rails and responsive only to energy of said preselected frequency received through the rails from said track circuit source when said section is unoccupied for inducing said second signal in that transformer secondary winding, (2) said saturable transformer further includes a separate short-circuited single turn winding to provide a constant low impedance load, (c) said secondary windings of both transformers are connected in series into said circuit network for supplying said first and second signals to actuate passage of sufficient current by said varistor element to register an unoccupied track section only when both signals are present, are of said preselected frequency, and are within a predetermined range of phase relationship.

9. A track circuit arrangement, for an insulated track section of an electrified railroad having an alternating current propulsion power source of a first selected frequency with a return circuit through the section rails, comprising in combination, (a) another source of alternating current energy of a second preselected frequency coupled to the rails at one end of said section, (b) a frequency responsive circuit network having a first input means coupled for receiving signals direct from said other source and a second input means coupled to said rails at the other end of said section for receiving signals from said other source only through said section rails when intact and the section is unoccupied by a train, (c) said circuit network further including a filter element tuned to said second preselected frequency and a varistor device coupled in series with said first and second input means for processing said input signals to produce an output product current signal only when both input signals are present, are of said second preselected frequency, and are within a predetermined phase relationship, and (d) a registry means coupled to said circuit network for registering an unoccupied track section only when an output signal is produced.

10. A track circuit arrangement as defined in claim 9 in which, (a) said first input means is a transformer connected for coupling said circuit network to receive signals from said second source, (b) said second input means is a saturable transformer with a short circuited single turn winding for loading the transformer at a constant low impedance, and (c) the primary winding of said saturable transformer is connected to said rails at said other end by a circuit path tuned to said second preselected frequency for coupling said circuit network to receive signals through said rails only from said other source.

11. A track circuit arrangement as defined in claim 9 or 10 in which said circuit network further includes, (a) a full-wave rectifier with input terminals connected in series with the remaining elements of said network for receiving current of said preselected second frequency passed by said varistor device, and in which, (b) said registry means is a direct current biased relay coupled to the output terminals of said rectifier and responsive only to an output signal of proper polarity and predetermined energy level from said rectifier for registering an unoccupied track section, (c) said rectifier produces an output signal of at least said predetermined energy level only when both input signals are present, are of said preselected frequency, and are within said predetermined phase relationship.

* * * * *